(12) United States Patent
McCabe

(10) Patent No.: US 11,165,384 B1
(45) Date of Patent: Nov. 2, 2021

(54) METHOD FOR HANGING PV MODULES

(71) Applicant: Joseph McCabe, Littleton, CO (US)

(72) Inventor: Joseph McCabe, Littleton, CO (US)

(*) Notice: Subject to any disclaimer, the term of this patent is extended or adjusted under 35 U.S.C. 154(b) by 214 days.

(21) Appl. No.: 16/413,352

(22) Filed: May 15, 2019

Related U.S. Application Data

(60) Provisional application No. 62/673,840, filed on May 18, 2018.

(51) Int. Cl.
H02S 20/30 (2014.01)
H02S 30/10 (2014.01)
H02S 20/32 (2014.01)

(52) U.S. Cl.
CPC .............. *H02S 20/30* (2014.12); *H02S 20/32* (2014.12); *H02S 30/10* (2014.12)

(58) Field of Classification Search
CPC ........... H02S 20/30; H02S 20/32; H02S 30/10
See application file for complete search history.

(56) References Cited

U.S. PATENT DOCUMENTS

| | | | |
|---|---|---|---|
| 2,808,913 A | 10/1957 | Frieder | |
| 4,310,979 A | 1/1982 | Bloom | |
| 4,503,631 A | 3/1985 | Kelly | |
| 4,816,324 A | 3/1989 | Berman | |
| 4,912,865 A | 4/1990 | Ellsworth | |
| 5,125,608 A | 6/1992 | McMaster | |
| 5,377,945 A | 1/1995 | Steinke | |
| 5,526,906 A | 6/1996 | Vandiver | |
| 5,746,839 A | 5/1998 | Dinwoodie | |
| 5,762,720 A | 6/1998 | Hanoka | |
| 5,775,471 A | 7/1998 | Vandiver | |
| 5,990,413 A | 11/1999 | Ortabasi | |
| 6,046,401 A | 4/2000 | McCabe | |
| 6,148,570 A | 11/2000 | Dinwoodie | |
| 6,495,750 B1 | 12/2002 | Dinwoodie | |
| 6,534,703 B2 | 3/2003 | Dinwoodie | |
| 6,563,040 B2 | 5/2003 | Hayden | |
| 6,570,084 B2 | 5/2003 | Dinwoodie | |
| 6,722,357 B2 | 4/2004 | Shingleton | |
| 6,809,251 B2 | 10/2004 | Dinwoodie | |
| 7,285,719 B2 | 10/2007 | Conger | |
| 7,389,603 B1 | 6/2008 | Brumfield | |

(Continued)

FOREIGN PATENT DOCUMENTS

AU 2004221388 B2 4/2011
EP 2669596 A1 12/2013

OTHER PUBLICATIONS

Joel H. Goodman, "Building Integrated Tracking PV and Daylighting Final Report", Wisconsin Energy Bureau, Aug. 1999.

(Continued)

*Primary Examiner* — Matthew T Martin

(57) ABSTRACT

The invention relates to a photovoltaic (PV) module or array of PV modules which are pivotally mounted from an upper edge and thus designed to hang under the force of gravity and to swing about the upper edge responsive to wind. The invention further includes various motion damping systems calibrated to limit or slow said swinging motion. The invention further includes a preferred mounting means comprising at least one ring or cylinder or sleeve or hinge attached to the upper edge of PV modules with a spring calibrated to limit or dampen the swinging motion.

15 Claims, 15 Drawing Sheets

(56) References Cited

U.S. PATENT DOCUMENTS

| | | | |
|---|---|---|---|
| 7,557,292 B2 | 7/2009 | Shingleton | |
| 7,730,676 B2 | 6/2010 | Hon | |
| 7,847,185 B2 | 12/2010 | Schwarze | |
| 8,381,464 B2 | 2/2013 | Conger | |
| 8,429,861 B2 | 4/2013 | Conger | |
| 8,468,728 B2 | 6/2013 | Nabors | |
| 8,546,681 B2 | 10/2013 | Wares | |
| 8,584,406 B2 | 11/2013 | Wexler | |
| 8,739,737 B2 | 6/2014 | Conger | |
| 8,749,402 B2 | 6/2014 | Townsend | |
| 8,793,942 B2 | 8/2014 | Almy | |
| 8,875,450 B2 | 11/2014 | Conger | |
| 8,925,260 B2 | 1/2015 | Conger | |
| 8,940,997 B2 | 1/2015 | Conger | |
| 8,981,202 B2 | 3/2015 | Conger | |
| 8,984,783 B2 | 3/2015 | Cepek | |
| 9,243,818 B2 | 1/2016 | Shugar | |
| 9,252,311 B2 | 2/2016 | Wolter | |
| 9,286,814 B1 | 3/2016 | Thomaselli | |
| 9,289,039 B2 | 3/2016 | Akin | |
| 9,312,418 B2 | 4/2016 | Beckerman | |
| 9,335,069 B2 | 5/2016 | Debartolo | |
| 9,391,557 B2 * | 7/2016 | Okandan | F24S 25/50 |
| 9,404,677 B2 | 8/2016 | Sankrithi | |
| 9,406,248 B2 | 8/2016 | Dalton | |
| 9,595,627 B2 | 3/2017 | Morgan | |
| 9,607,532 B2 | 3/2017 | Gibson | |
| 9,612,004 B2 | 4/2017 | Hemiller | |
| 9,654,053 B2 | 5/2017 | Panish | |
| 9,657,967 B2 | 5/2017 | Adriani | |
| 9,697,754 B2 | 7/2017 | White | |
| 9,781,985 B2 | 10/2017 | Akin | |
| 9,845,972 B2 | 12/2017 | West | |
| 9,988,776 B2 | 5/2018 | Holland | |
| 10,008,134 B2 | 5/2018 | Pura | |
| 10,090,799 B2 | 10/2018 | Dalland | |
| 10,110,161 B2 | 10/2018 | Lerner | |
| 10,152,903 B2 | 12/2018 | Dalton | |
| 10,269,271 B2 | 5/2019 | White | |
| 2003/0062037 A1 * | 4/2003 | Hayden | H02S 20/00 |
| | | | 126/570 |
| 2015/0083198 A1 * | 3/2015 | Jimbo | F24S 40/85 |
| | | | 136/251 |
| 2020/0076359 A1 * | 3/2020 | Bahn | F24S 40/20 |
| 2020/0153380 A1 * | 5/2020 | Hildebrandt | F16B 9/05 |

OTHER PUBLICATIONS https://www.solarpowerworldonline.com/2018/02/fixed-tilt-vs-tracker-one-size-fits-approach-can limit-solar-production/.
https://www.seriius.org/pdfs/highlight-pv4-less-is-more.pdf.
https://pvpmc.sandia.gov/pv-research/bifacial-pv-project/.
https://ieeexplore.ieee.org/abstract/document/8534404.
https://pvpmc.sandia.gov/download/6858/.
https://pvpmc.sandia.gov/download/6908/.
https://pvpmc.sandia.gov/download/6810/.
https://pvpmc.sandia.gov/download/6805/.
https://pvpmc.sandia.gov/download/6348/.
https://pvpmc.sandia.gov/download/6046/.
https://pvpmc.sandia.gov/download/5962/.
https://pvpmc.sandia.gov/download/5893/.
https://ieeexplore.ieee.org/stamp/stamp.jsp?arnumber=7387697.
https://pvpmc.sandia.gov/download/6100/.
www.solarworld-usa.com/~/media/www/files/white-papers/calculating-additional-energy-yield through-bifacial-solar-technology-sw9002us.pdf.
https://www.renewableenergyworld.com/articles/2012/07/a-new-competitive-landscape-for solar-pv-racking.html.
https://www.renewableenergyworld.com/articles/2011/01/finding-the-apple-computer-of-solar power.html.

\* cited by examiner

METHOD FOR HANGING PV MODULES

CROSS REFERENCE TO RELATED APPLICATIONS

This application claims the benefit of U.S. Provisional Application filed May 18, 2018, Application No. 62/673,840 filed by Joseph McCabe with the title "Method for hanging PV modules".

U.S. Pat. No. 10,269,271 White, Apr. 23, 2019, Display mounting system and method U.S. Pat. No. 10,152,903 Dalton, Dec. 11, 2018, Swinging sign apparatus U.S. Pat. No. 10,110,161 Lerner, et al., Oct. 23, 2018, Systems and methods for applying flexible solar panels to flexible underlying membranes U.S. Pat. No. 10,090,799 Dalland, et al., Oct. 2, 2018, Tensioned sheet-metal based solar panels and structures for supporting the same U.S. Pat. No. 9,988,776 Holland, et al., Jun. 5, 2018, Wind screens for photovoltaic arrays and methods thereof U.S. Pat. No. 10,008,134 Pura, et al., Jun. 26, 2018, Outdoor sign system and a method of using the same U.S. Pat. No. 9,916,783 Ashworth, et al., Mar. 13, 2018, Banner support assembly U.S. Pat. No. 9,845,972 West, et al., Dec. 19, 2017 Torque tube mounted photovoltaic apparatus, system, and method U.S. Pat. No. 9,697,754 White, Jul. 4, 2017, Display mounting system and method U.S. Pat. No. 9,657,967 Adriani, et al., May 23, 2017, Rotatable support system for mounting one or more photovoltaic modules U.S. Pat. No. 9,654,053 Panish, May 16, 2017, Solar module support structure U.S. Pat. No. 9,607,532 B2, Gibson, Mar. 28, 2017, Movable signage apparatus and method U.S. Pat. No. 9,595,627 Morgan, Mar. 14, 2017, Photovoltaic panel U.S. Pat. No. 9,781,985 Akin, et al. Oct. 10, 2017, High capacity solar charging umbrella with wireless charging U.S. Pat. No. 9,406,248 Dalton, Aug. 2, 2016, Swinging sign apparatus U.S. Pat. No. 9,404,677 Sankrithi, Aug. 2, 2016, Inflatable linear heliostatic concentrating solar module U.S. Pat. No. 9,335,069 DeBartolo III, et al. May 10, 2016, Solar energy collecting systems and methods U.S. Pat. No. 9,312,418 Beckerman, et al. Apr. 12, 2016, Frameless photovoltaic module U.S. Pat. No. 9,612,004 Hemiller, Apr. 4, 2017, Display module mounting U.S. Pat. No. 9,289,039 Akin, et al. Mar. 22, 2016, Sunshades with solar power supplies for charging electronic devices U.S. Pat. No. 9,286,814 Thomaselli, et al. Mar. 15, 2016, Portable sign assembly U.S. Pat. No. 9,252,311 Wolter, Feb. 2, 2016, Solar panel system with monocoque supporting structure U.S. Pat. No. 9,243,818 Shugar, et al. Jan. 26, 2016, Stackable tracking solar collector assembly U.S. Pat. No. 8,984,783 Cepek, Mar. 24, 2015, Method and kit for modifying a corrugated sign assembly U.S. Pat. No. 8,981,202 Conger, Mar. 17, 2015, Solar array support methods and systems U.S. Pat. No. 8,940,997 Conger, Jan. 27, 2015, Solar array support methods and systems U.S. Pat. No. 8,925,260 Conger, Jan. 6, 2015, Solar array support methods and systems U.S. Pat. No. 8,875,450 Conger, Nov. 4, 2014, Solar array system for covering a body of water U.S. Pat. No. 8,793,942 Almy, et al., Aug. 5, 2014, Photovoltaic assemblies and methods for transporting U.S. Pat. No. 8,749,402 Townsend, Jr. Jun. 10, 2014, Devices, systems and methods for reinforcing a traffic control assembly U.S. Pat. No. 8,739,737 Conger, et al., Jun. 3, 2014, Rack system and monitoring for animal husbandry U.S. Pat. No. 8,584,406 Wexler, et al. Nov. 19, 2013, Hole-thru-laminate mounting supports for photovoltaic modules U.S. Pat. No. 8,546,681 Wares, et al., Oct. 1, 2013, Device and method for solar power generation U.S. Pat. No. 8,468,728 Nabors, Jr., Jun. 25, 2013, Breakaway outdoor signs U.S. Pat. No. 8,429,861 Conger, Apr. 30, 2013, Solar array support methods and systems U.S. Pat. No. 8,381,464 Conger, Feb. 26, 2013, Solar array support methods and systems U.S. Pat. No. 7,847,185 Schwarze, Dec. 7, 2010, Lightweight photovoltaic system U.S. Pat. No. 7,730,676 Hon, Jun. 8, 2010, Solar panel supporting system U.S. Pat. No. 7,557,292 Shingleton, et al. Jul. 7, 2009, Modular shade system with solar tracking panels U.S. Pat. No. 7,389,603 Brumfield, Jun. 24, 2008, Modular sign post U.S. Pat. No. 7,285,719 Conger, Oct. 23, 2007, Solar array support methods and systems U.S. Pat. No. 6,809,251 Dinwoodie, Oct. 26, 2004, Inclined photovoltaic assembly U.S. Pat. No. 6,722,357 Shingleton, Apr. 20, 2004, Fixed angle solar collector arrangement U.S. Pat. No. 6,570,084 Dinwoodie, May 27, 2003, Pressure equalizing photovoltaic assembly and method U.S. Pat. No. 6,563,040 Hayden, et al., May 13, 2003, Structure for supporting a photovoltaic module in a solar energy collection system U.S. Pat. No. 6,534,703 Dinwoodie, Mar. 18, 2003, Multiposition photovoltaic assembly U.S. Pat. No. 6,495,750 Dinwoodie, Dec. 17, 2002, Stabilized PV system U.S. Pat. No. 6,148,570 Dinwoodie, et al., Nov. 21, 2000, Photovoltaic building assembly with continuous insulation layer U.S. Pat. No. 6,046,401 McCabe, Mar. 5, 1999, Display device integrated into a photovoltaic panel U.S. Pat. No. 5,990,413 Ortabasi, Nov. 23, 1999, Bifacial lightweight array for solar power U.S. Pat. No. 5,775,471 Vandiver, et al. Jul. 7, 1998, Method for connecting a slender structure to a reference body and for suppressing the vibration of such slender structures U.S. Pat. No. 5,762,720 Hanoka, et al., Jun. 9, 1998, Solar cells modules with integral mounting structure and method for forming same U.S. Pat. No. 5,746,839 Dinwoodie, May 5, 1998, Lightweight, self-ballasting photovoltaic roofing assembly U.S. Pat. No. 5,551,178 Foley, et al. Sep. 3, 1996, Collapsible sign U.S. Pat. No. 5,526,906 Vandiver, et al., Jun. 18, 1996, Method and apparatus for connecting a slender structure to a reference body and for suppressing the vibrations of such slender structures U.S. Pat. No. 5,377,945 Steinke, Jan. 3, 1995, Mount for redressably mounting a sign U.S. Pat. No. 5,316,592 Dinwoodie, May 31, 1994, Solar cell roofing assembly
U.S. Pat. No. 4,912,865 Ellsworth, et al. Apr. 3, 1990, Multi-axis pivoting display sign
U.S. Pat. No. 5,125,608 McMaster, et al., Jun. 30, 1992, Photovoltaic panel support assembly
U.S. Pat. No. 4,816,324 Berman, Mar. 28, 1989, Flexible photovoltaic device
U.S. Pat. No. 4,503,631 Kelly, Mar. 12, 1985, Blow-through pivotal sign
U.S. Pat. No. 4,310,979 Bloom, Jan. 19, 1982, Breakaway dual-legged sign support
U.S. Pat. No. 2,808,913 Frieder et al., Oct. 8, 1957, Catenary supporting cable construction Foreign Patent Documents AU2004221388B2, Orsello, Apr. 14, 2011, Method and system for concentration of solar thermal energy
EP 2 669 596 A1, Buechel, Dec. 4, 2013, Solar array Other References "Building Integrated Tracking PV and Daylighting Final Report", Wisconsin Energy Bureau, August 1999 by Joel H. Goodman
https://www.solarpowerworldonline.com/2018/02/fixed-tilt-vs-tracker-one-size-fits-approach-can-limit-solar-production/
https://www.seriius.org/pdfs/highlight-pv4-less-is-more.pdf
https://pvpmc.sandia.gov/pv-research/bifacial-pv-project/
https://ieeexplore.ieee.org/abstract/document/8534404
https://pvpmc.sandia.gov/download/6858/
https://pvpmc.sandia.gov/download/6908/
https://pvpmc.sandia.gov/download/6810/
https://pvpmc.sandia.gov/download/6805/
https://pvpmc.sandia.gov/download/6348/
https://pvpmc.sandia.gov/download/6046/
https://pvpmc.sandia.gov/download/5962/
https://pvpmc.sandia.gov/download/5893/
https://ieeexplore.ieee.org/stamp/stamp.jsp?amumber=7387697
https://pvpmc.sandia.gov/download/6100/
www.solarworld-usa.com/-/media/www/files/white-papers/calculating-additional-energy-yield-through-bifacial-solar-technology-sw9002us.pdf
https://www.renewableenergyworld.com/articles/2012/07/a-new-competitive-landscape-for-solar-pv-racking.html
https://www.renewableenergyworld.com/articles/2011/01/finding-the-apple-computer-of-solar-power.html

BACKGROUND OF THE INVENTION

The invention pertains to solar electric modules. More specifically, the invention pertains the structure holding solar electric modules.

BRIEF SUMMARY OF THE INVENTION

The invention is a structural attachment which allows PV modules to swing freely in the wind. Bifacial photovoltaic or PV modules have come down in price justifying this invention. Currently the cost of bifacial PV modules have reached the point where they can be produced for only a few pennies more than conventional one sided PV modules. Conventionally PV modules are mounted to face south (in the northern hemisphere) at an angle such that they are perpendicular to the sun at noon. module must be robust enough to support its own weight as well as any likely snow This is to gather maximum sunlight but it also suggests that the module must be robust enough to support its own weight as well as any likely snow accumulation and wind coming from any direction. Modules must also be able to resist damage from hail if they are to be used in areas which are subject to hail. Doubling the size of a PV module suggests that the wind forces will increase by the square of a dimension.

Also, the southward orientation suggests that the power output from conventionally mounted PV modules will increase from nearly zero at dawn to maximum electrical output at noon and then decrease to near zero at dusk.

The invention relates to bifacial or double sided modules which are hung vertically and designed to swing in the wind, thus the modules and the support for the modules need not be as robust as modules which are fixedly mounted to face in a particular direction and at a particular angle. Because the PV modules can move with the wind and since they are vertical, hail should not be a problem because hail falls downward, parallel to vertically hung modules. Also, because of the vertical ideally east-west orientation, the modules will produce maximum power after sunrise and before sunset and less power at noon, the opposite of conventionally mounted modules.

The invention also includes various means to dampen and reduce the swinging movement of modules to prevent damage in high winds and reducing the strength requirements for the overall PV module mounting structure.

The invention reduces soiling of the PV modules along with reduced bird resting places. Potential for fire spread is reduced because the modules are separated from each other and ma be hung far from the ground. Module costs can be reduced by eliminating the full frame or by reducing frame lengths. Additional savings are achieved by reducing PV module glass thickness and reduced cost for screen printing electrical grids on the PV cells, and by reducing the cost of interconnection wiring of the cells. A PV module having reduced sunlight incident on the surfaces reduces the wiring requirements inside a PV module. Because the modules can be installed vertically, land area requirements can be reduced along with the associated civil engineering and ground preparations being reduced. The electrical balance of systems (BOS) can be reduced on the solar system because the maximum sunlight and thus electrical generation curve is lower, but the annual harvested energy is often higher. Electrical equipment is reduced approximately 25% off the cost of a normal PV system because peak sunlight is reduced 25%. Warranties for PV modules should be easier to maintain because full 100% sun power isn't achieved over the lifetime of the modules.

DETAILED DESCRIPTION OF THE INVENTION

Figure 1:
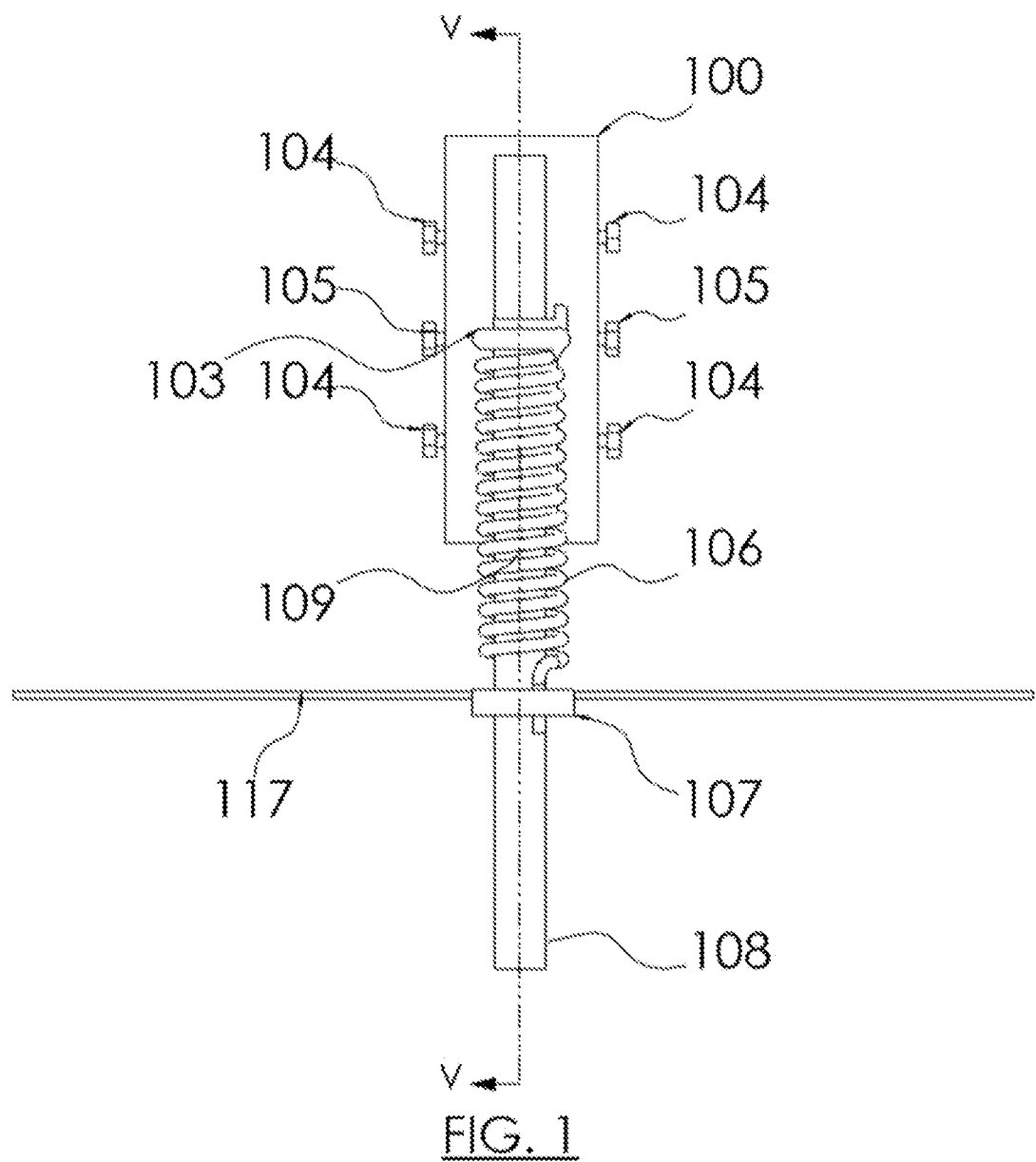
FIG. 1 illustrates a top view of the solar PV module attachment, without the PV module shown, including mechanical gear to hold a solar PV module thus enabling a controllable swing/sway in the wind about the axis of the rod/cable assembly.
Figure 2:
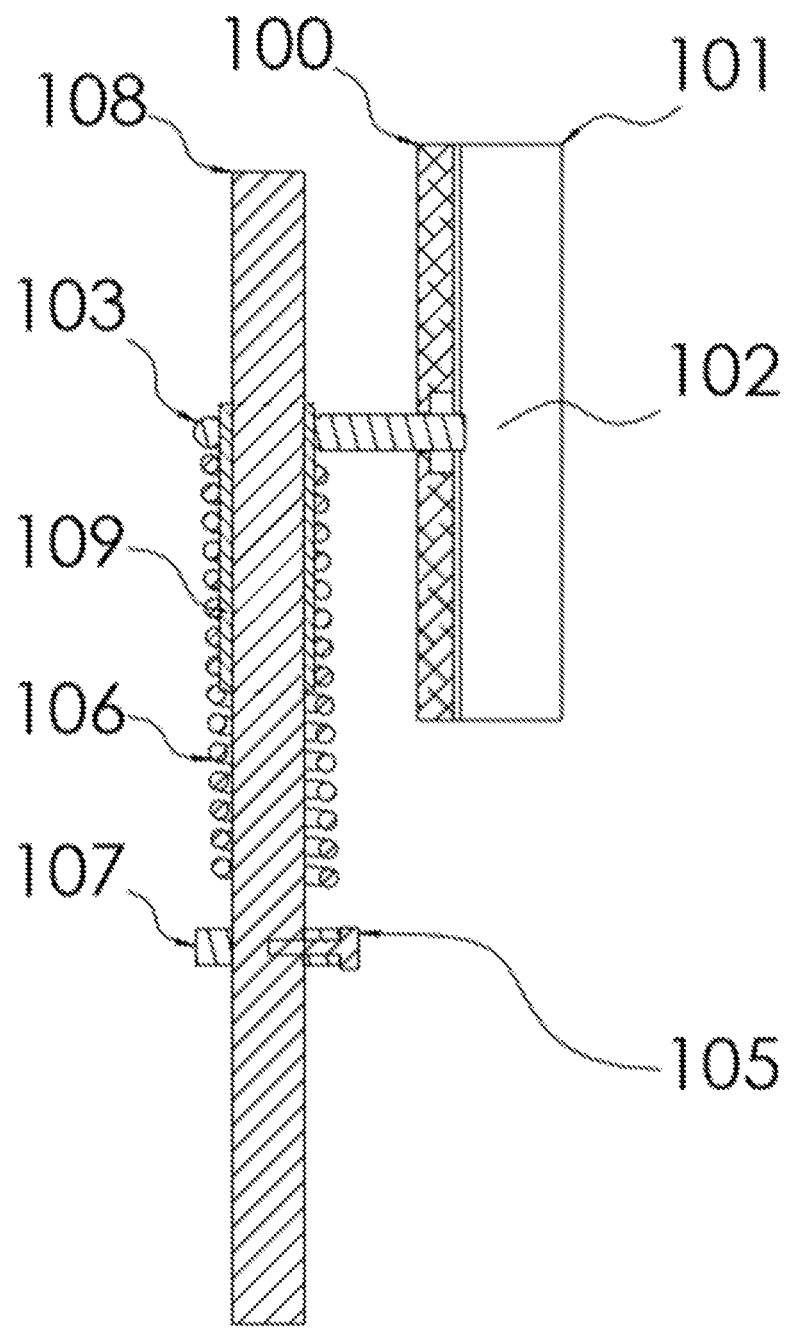
FIG. 2 illustrates the section view of the solar PV module attachment in FIG. 1 taken along the section lines V-V.

This invention is vertically hanging PV modules and allowing them to sway and swing with the wind. There are no motors or linkages connecting or between PV modules. The vertical orientation of the no-wind and low-wind situation is unique in that it allows for solar energy to be captured on both sides of the PV modules, in the morning and evening for a north-south orientation. This is instead of one side facing the equator at an angle to the horizontal in typical orientations. PV modules have thought to need a rigid structure but with this disclosure, a rigid structure is not required. This design reduces the need for an expensive metal PV module frame, reduces electrical balance of systems costs and potentially allows for PV modules designed with less or no glass as well as other reduced costs of operating solar electric systems including operating and maintenance costs.

The invention is unique in that it isn't a tracker, modules are not linked to each other. There is no motorized PV module tilting mechanisms. This invention has no reflecting of light, there are no mirrors employed. Sunlight is absorbed by PV modules, not as a means to reflect, display or optically transmit any images or information. Ideally a PV module absorbs all the available light and converts it into electricity. PV modules are large surfaces with complex internal circuitry and multiple PV cells connected together by a printed circuit where flexing would immediately destroy the complex system.

The approach is to secure PV modules by only one edge with the moment of the force from the wind acting about an axis, thus eliminating problems and costs of conventional mounting PV modules in a rigid frame. The solar industry uses at least two edges and often four edges to secure PV modules. Rigid frames secured by two or more edges set up compression and tension forces in the PV module requiring the PV module to be made strong enough to resist these forces. In contrast, this invention allows only one edge to be an axis of rotation horizontally without exposing the PV module to compressive forces from the wind except upon the leading edge.

In conventional PV module structures the center of the PV module acts like a load bearing surface. Men a wind load is applied there are compression forces on the wind facing side and tension forces on the back side flexing the PV modules in the middle, with the flexing forces dependent on the size of the PV module and the amount of wind. The PV module will fail in a tension if not constructed properly. Whereas, with the invention, the PV module is designed to pivot with/in the wind in a controlled manner. By securing just one edge of the PV module the mechanism can resist the rotational forces with a spring, and harmonic forces are resisted with damping. The PV module swings freely up out of the way of the wind, but can be slowed in its decent so that the PV modules do not flap freely in the wind. Thus harmonic frequency and vibrations are reduced and the PV module can not be snapped in the wind by energy waves passing through the PV modules from end to end or side to side. Any upward movement of the PV modules can also be acting to reduce wind forces on support columns. This invention celebrates gravity, uses gravity and controls gravitational forces on PV modules. The PV modules will pivot, revolve, rotate, swing, hinge, pirouette, axis, or swivel about a horizontal axis with wind forces and gravitational forces. The movement can be controlled by spring and damping means.

Figure 3:
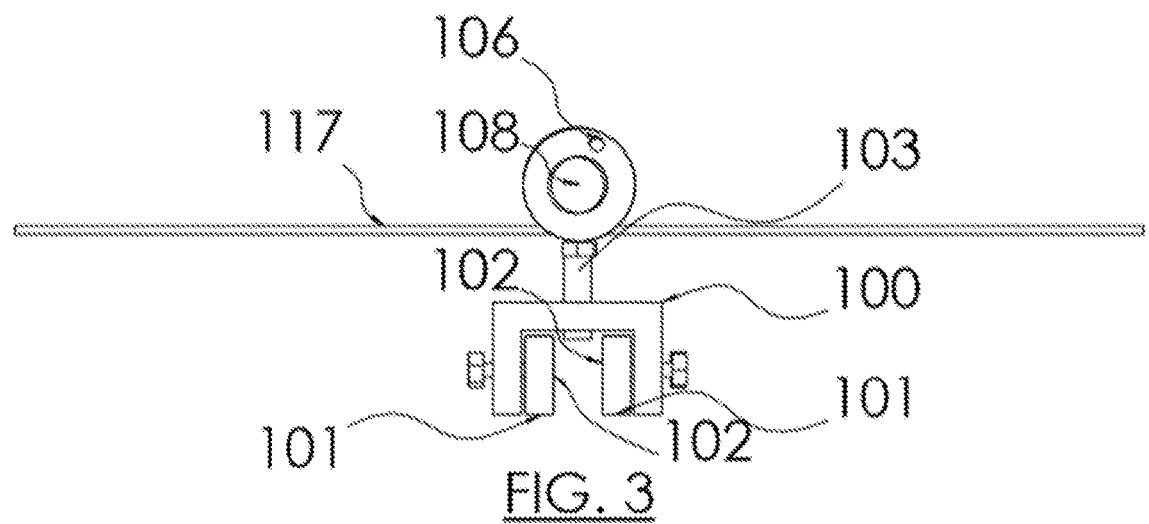
FIG. 3 illustrates the edge view of the solar PV module attachment including the solar PV module.
Figure 4:
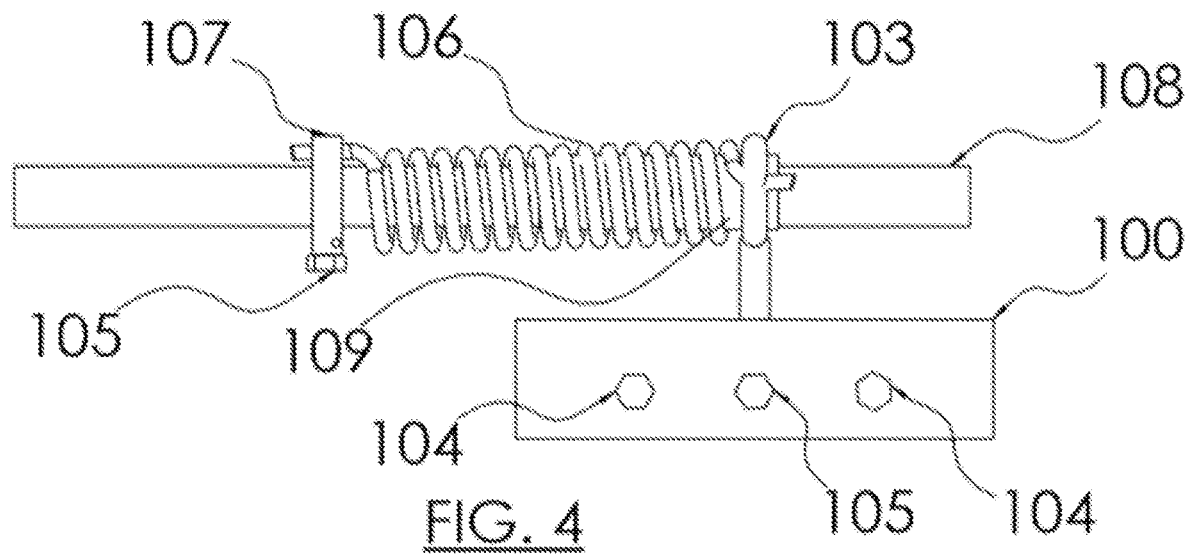
FIG. 4 illustrates the front view of the solar PV module attachment.
Figure 5:
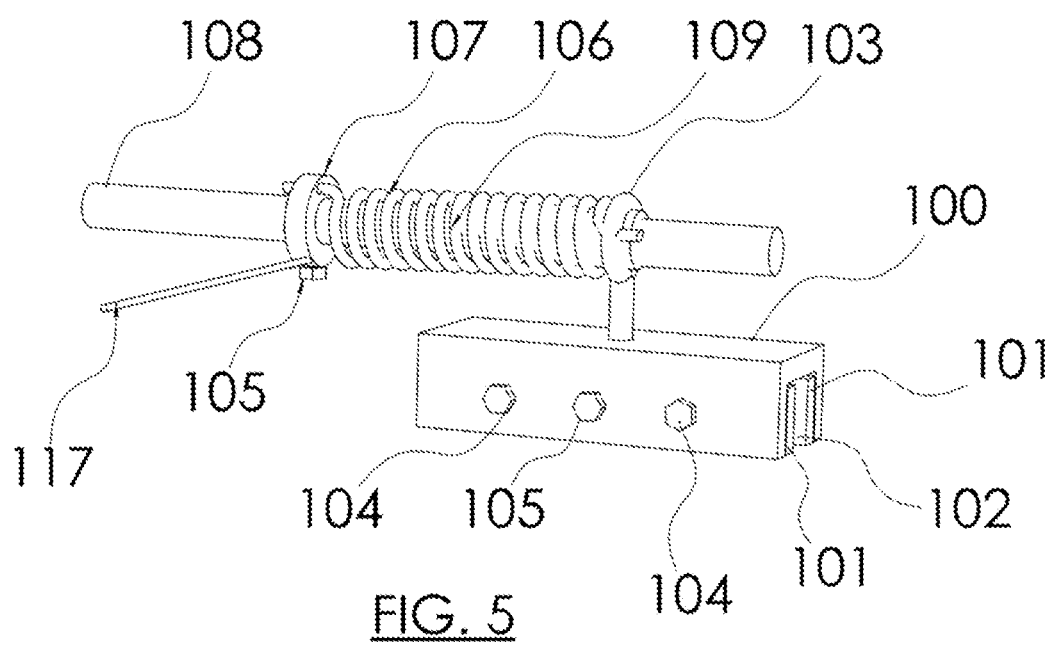
FIG. 5 illustrates a perspective view of the solar PV module attachment.
Figure 6:
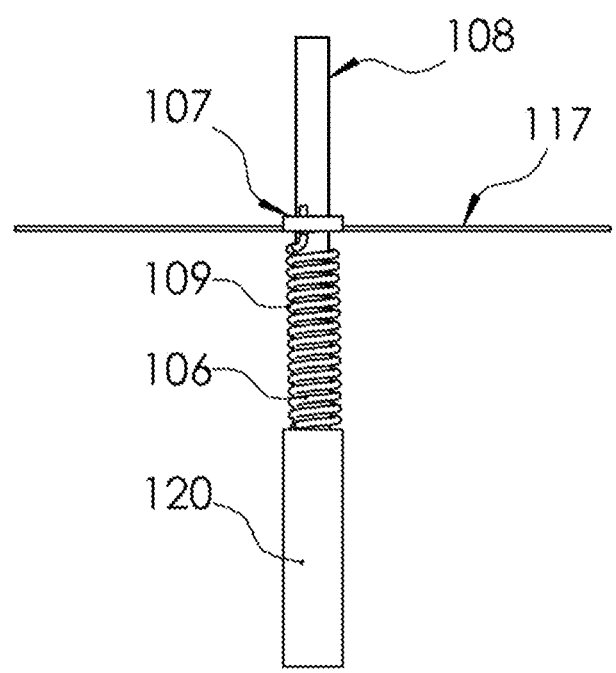
FIG. 6 illustrates a top view of the laminated cylinder with tab.
Figure 7:
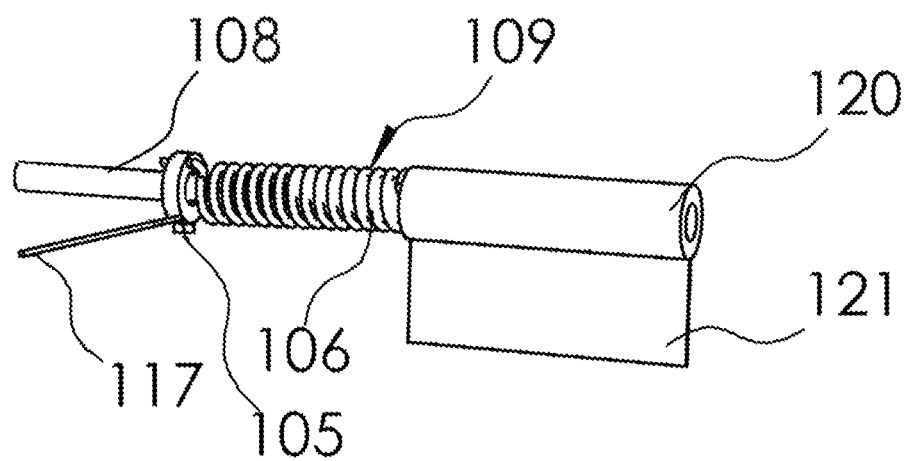
FIG. 7 illustrates a perspective view of the laminated cylinder with tab.
Figure 8:
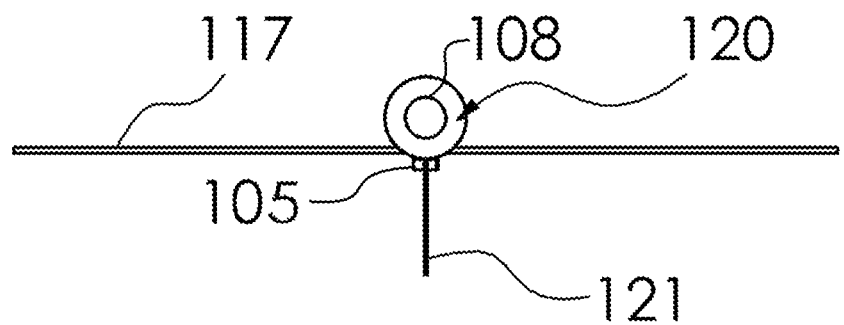
FIG. 8 illustrates an edge view of the laminated cylinder with tab.
Figure 9:
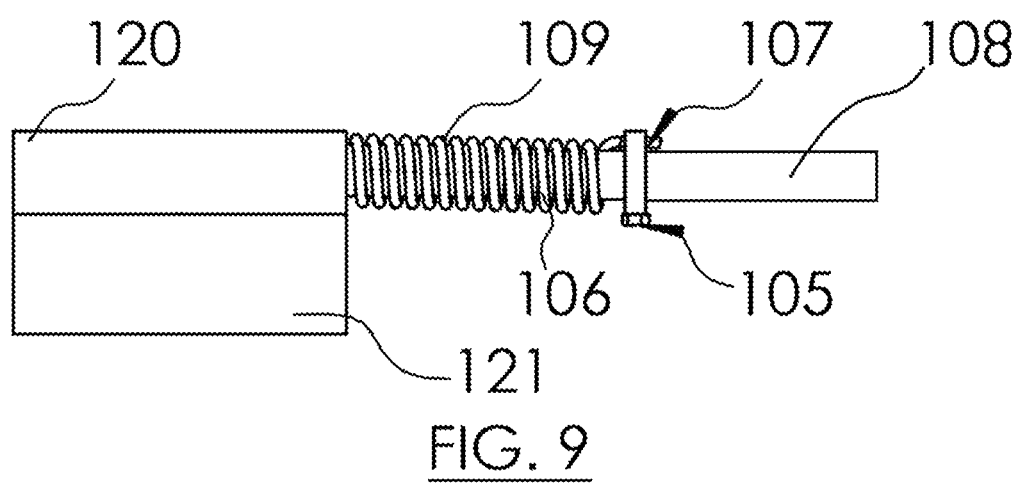
FIG. 9 illustrates a front view of the laminated cylinder with tab.
Figure 10:
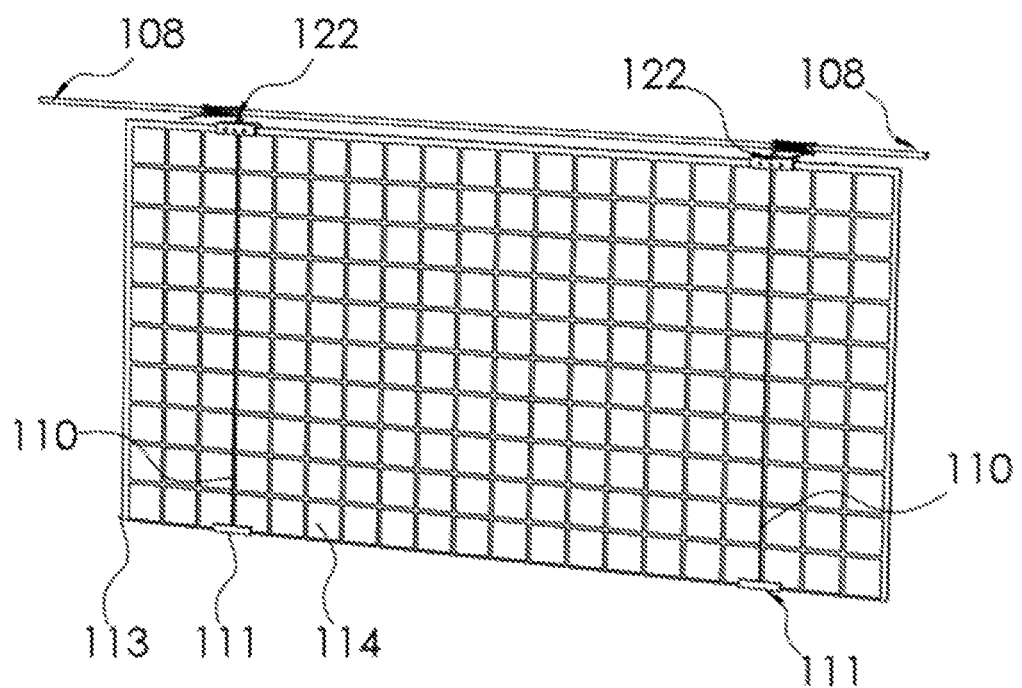
FIG. 10 illustrates a perspective view of a solar PV module with the solar PV module attachment and wire hangers with hanger clips at the bottom of the PV module.

FIGS. 1-5 and 10 illustrate the first preferred embodiment of the invention mechanism 122 as seen in FIG. 10. FIGS. 1-5 show the mechanism having a block 100 for holding a frameless PV module, sliders 101 for holding PV modules, adhesives 102 applied to the surface of the sliders 101. A ring or cylinder 103 is provided with a shaft to hang block 100. Slider bolts 104 compress the sliders to the PV modules and compress the adhesives, A wire set screws 105 is provided on the block for attaching optional hanger wires 110 later shown in FIGS. 11, 15 and 16. A torsion spring 106 and clamp 107 affixing the assembly to the rod or cable 108 with a cable set screw 105 are shown. The slider bolts 104 are different from set screws 105. One set screw 105 is shown on the cable or rod 108 and one set screw 105 is shown for the optional support wire 110. It should be noted here that I use the terms "rod or cable" to refer to a rod which is an elongated rigid member capable of supporting one or more photovoltaic panels or cable which is an elongated flexible member that may support one or more photovoltaic panels when the cables are under tension. A dampening cylinder 109 seen most clearly in FIG. 4 extends from the ring or cylinder 103 a predetermined distance into a torsion spring 106 and acts to slow swinging movement of the PV modules by frictional contact between moving parts of the attachment mechanism and the rod or cable. A brake or swing stop 117 can be seen clearly in FIGS. 1, 3 and 5 is to limit the swinging movement of the PV module. These components make up the PV module block attachment mechanism 122. The PV module block attachment mechanism 122 attaches to the top edge of a PV module holding the weight of the PV module in a vertical orientation. If a substantial wind is applied to either face of the PV module it will rotate about the axis of the ring or cylinder 103. A torsion spring 106 fitted into ring or cylinder 103 at one end and into the clamp 107 at the other end will resist movement of PV modules away from the vertical. The dampening cylinder 109 extends from the ring 103 a predetermined distance into spring 106 and acts similar to the function of a slow closing toilet seat mechanism. It dampens the swinging, keeping the PV module horizontal for longer than it would have remained horizontal without the damping mechanism. The brake 117 keeps the PV module from swinging too high in strong winds. Wind uplift forces will determine the best angle for the brake. The ring or cylinder 103 used to hang block 100 could just as easily be a bearing if reduced resistance to swinging isn't necessary. The clamp 107 may be set into position on the cable or rod 108 by the set screw 105 thus giving the spring a desired initial resistance and subsequent final resistance as the PV module swings in the wind. The entire assembly of FIGS. 1-5 are illustrated as 122 in FIG. 10. In regard to the first embodying it should be noted that damaged PV modules may be removed and replaced by releasing bolts 104 and removing the sliders and modules without disturbing other PV modules on the same rod or cable 108.

FIGS. 6-9 illustrate the second preferred embodiment for laminating a cylinder into the PV module for attachment to a support structure with rods or cables. Here cylinder 120 and lamination tab 121 replace the ring, block, sliders, adhesive and bolts seen on the PV module block attachment mechanism 122 as illustrated in FIG. 10. These components make up the PV module lamination attachment mechanism.

FIG. 10 illustrates the PV module block attachment mechanism 122 with optional hanger wires 110, hanger clips 111, along with the PV module 113, and PV cells 114, 200 PV cells 114 are shown. Here the rod or cable 108 is shown hanging one PV module 113. In actual use many PV modules are hung from the same rod or cable 108. Optional hanger wires 110 with clips 111 are thin and placed on the front and back of the PV module as to not shade the PV cells below. The clips 111 can also help to keep the PV module 113 front and back glass surfaces in compression by squeezing the front and back surfaces of the PV module together. In FIG. 10 there are two PV module block attachment mechanism 122 shown, one a left handed orientation and one a right handed orientation. With the torsion spring 106 and dampening cylinder 109 which acts to slow the movement of the swinging or swaying, the wind direction will be resisted and slowed from either direction. Dampening cylinder 109 can be similar to a slow closing toilet seat mechanism. However, the torsion spring 106 can compress around one of the dampening cylinders 109 and can potentially advantageously squeeze that cylinder. The damping cylinder 109 can work by causing friction between spring 106 and the rod or cable 108. A properly designed cylinder and spring material selection and sizing can itself provide the dampening and resistance to wind force needed. I have shown two attachment mechanisms 122 in FIG. 10, but depending on the size of the PV module I may provide any number depending on the size and weight of the PV module 113.

Figure 11:
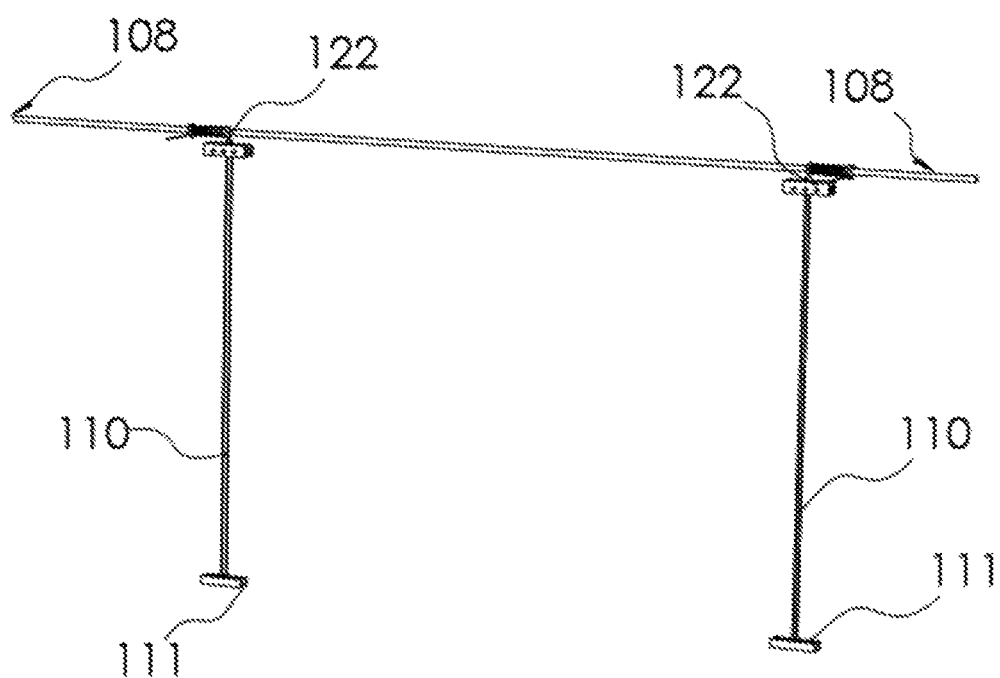
FIG. 11 illustrates a perspective view of the solar PV module attachment and wire hangers with hanger clips at the bottom without a solar PV module.

FIG. 11 is similar to FIG. 10 with the PV module and PV cells removed. This is meant to clearly illustrate the optional tensioning hanger wires 110 and edge attachments 111.

Figure 12:
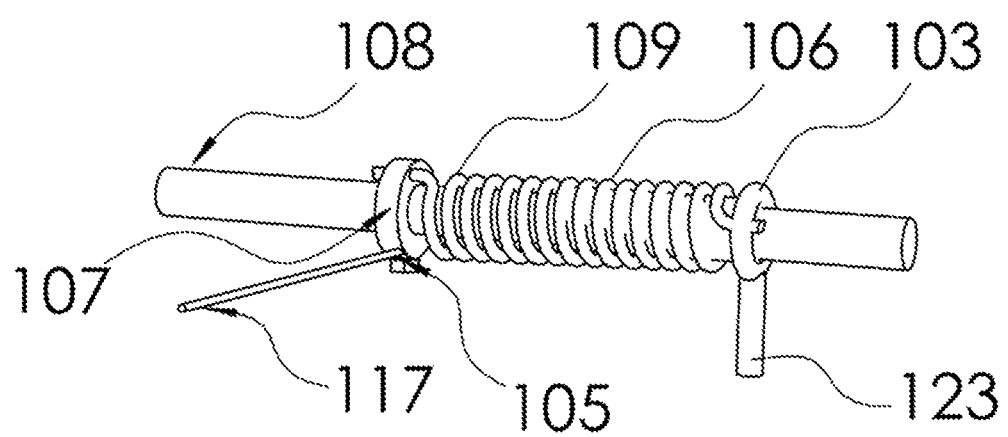
FIG. 12 illustrates a perspective view of the solar PV module attachment using just a ring and a threaded bolt for solar PV modules with standard frames; the attachment to the frame being the ring with threaded shaft to bolt to standard solar PV module frame.

FIG. 12 illustrates the third preferred embodiment for bolting directly into the PV module frame for attachment to a support structure with rods or cables 108. Here the ring or cylinder 103 has a threaded bolt 123 designed to thread directly into the upper frame of a PV module. These components make up the PV module ring and bolt attachment mechanism 126 seen in FIG. 13. This is for a PV module that has a frame attached at the factory. The ring or cylinder 103 and threaded bolt 123 can be bolted to a tapped threaded hole in a PV module, or a nut and washer can be used.

Figure 13:
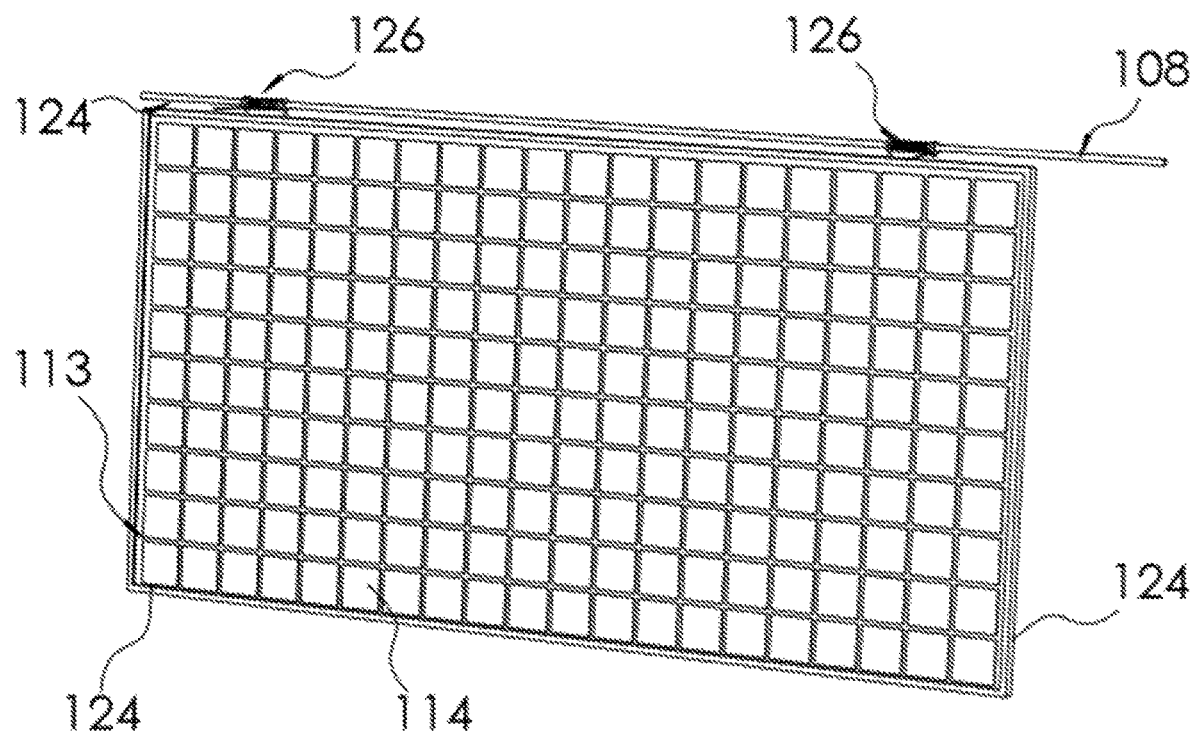
FIG. 13 illustrates a perspective view of a solar PV module with the ring and a threaded bolt for solar PV modules with standard frames.

FIG. 13 illustrates the cylinder or ring and bolt attachment mechanism 126 along with the PV module 113, and PV Cells 114. 200 cells 114 are shown. The PV module frame 124 is shown on the perimeter of the PV module 113. The ring and bolt attachment mechanism 103, 126 is attached to the upper edge of the PV module frame 124. Here the rod or cable 108 is shown holding up one PV module. The PV modules 113 are composite panels made up of many solar cells 114 connected together with a complex printed circuit.

Figure 14:
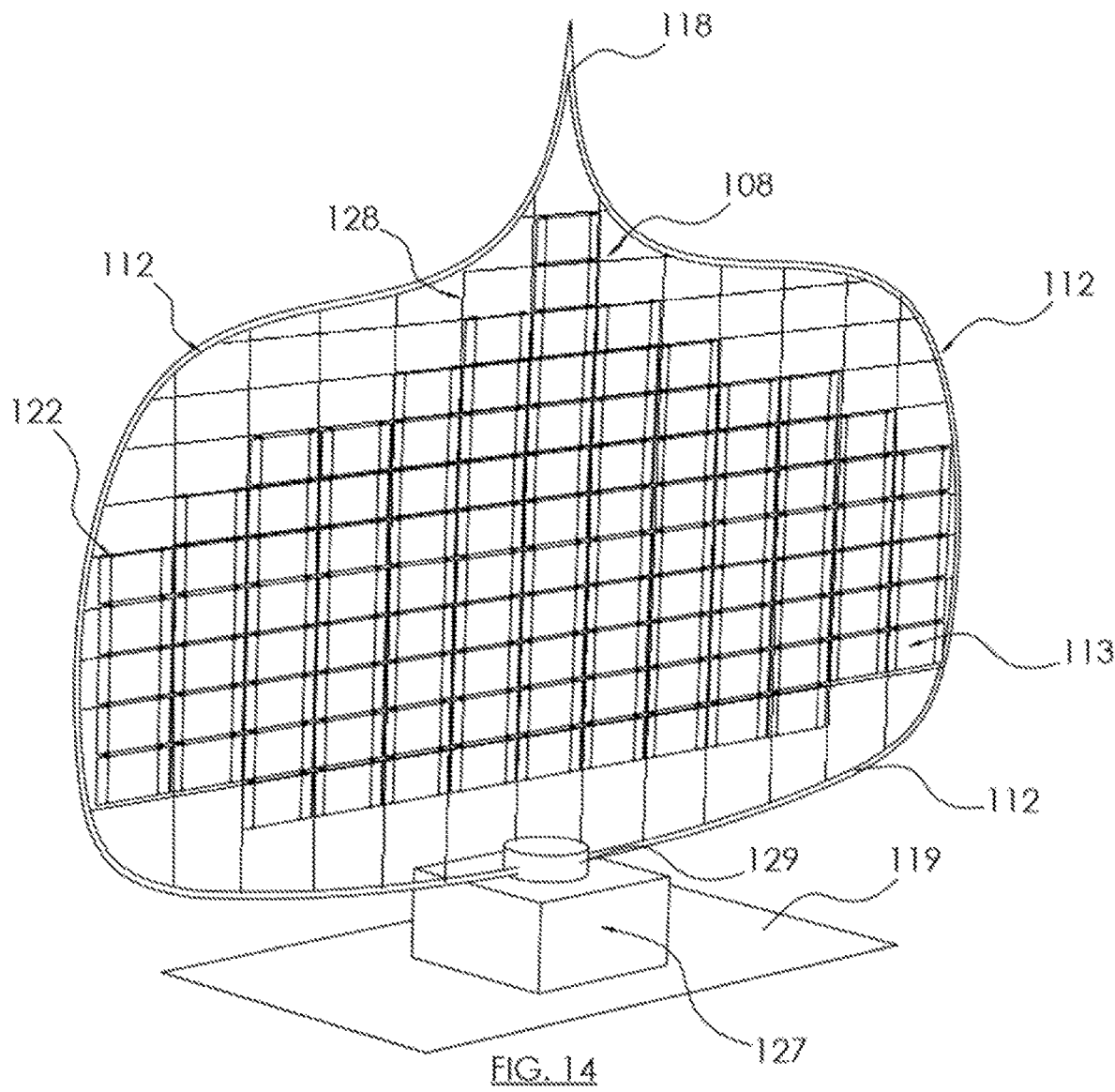
FIG. 14 illustrates a perspective view of a complete system with the solar PV module block attachment mechanism.

FIG. 14 illustrates a space frame 112 in the shape of a teardrop 118 supported by a pedestal base 127 and base attached system rotating mechanism 129. Pedestal base 127 can house electrical balance of system equipment. The PV modules 113 are supported by rods or cables 108, there are 107 PV modules 113 shown each with one of the three preferred embodiment attachments, the one being shown is the PV module block attachment mechanism 122. Vertical rods or cables 128 hung between PV modules 113 can be connected to horizontal rods or cables 108 to create a mesh web support system. Reflective ground surface or reflective roofing materials 119 are illustrated at the bottom of the system. The space frame 112 can be any shape that performs the function of hanging the PV modules, an apple, a corn cob, a circle or square. In the case of FIG. 14 it is a teardrop shape 118.

Figure 15:
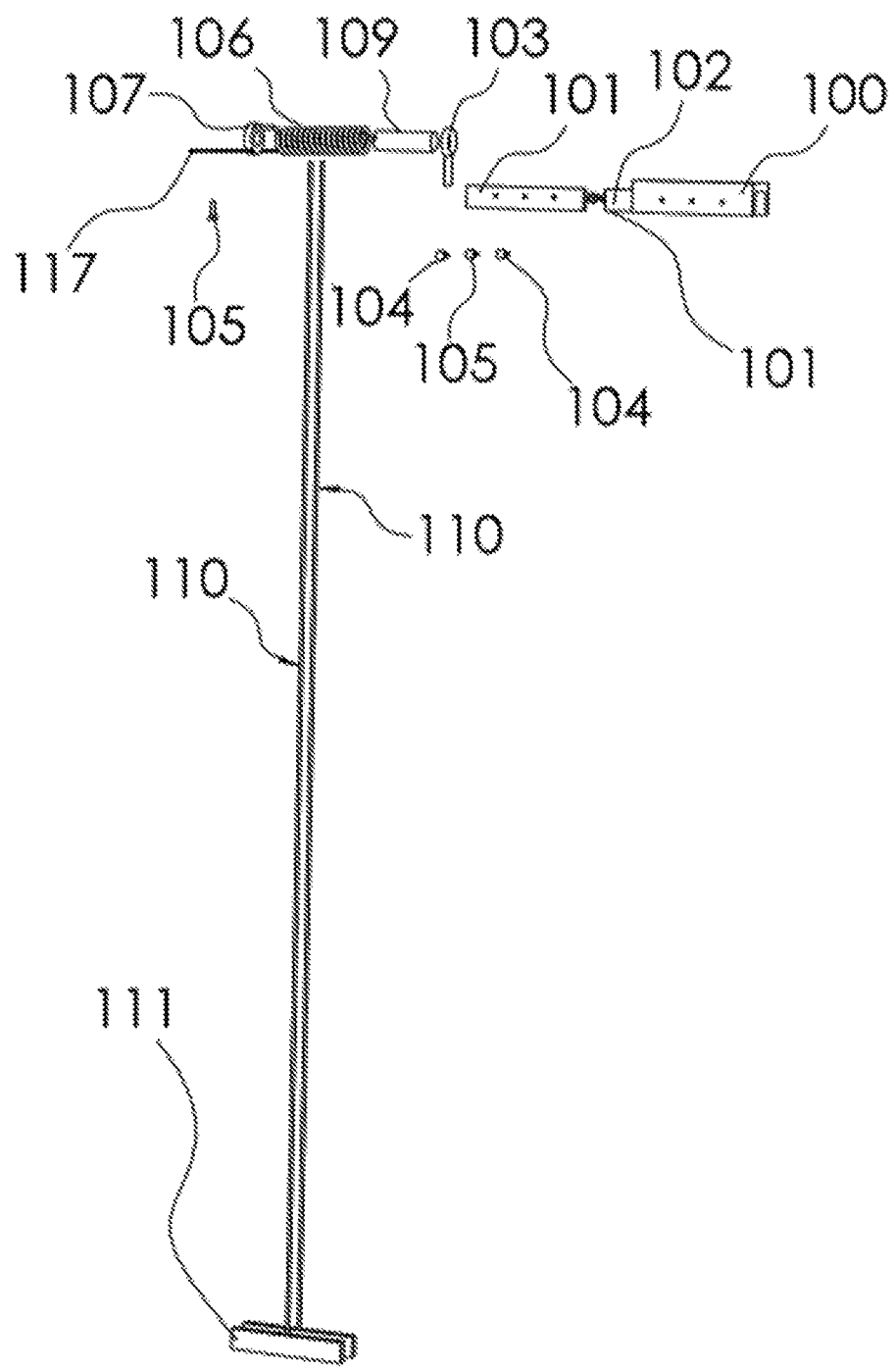
FIG. 15 illustrates a perspective view of the solar PV module block attachment mechanism components exploded.

FIG. 15 illustrates an exploded perspective view of the PV module block attachment mechanism components showing the block 100 for holding a frameless PV module, sliders 101 for holding PV modules, adhesives 102 helping to adhere the slider 101 to the PV module, the ring or cylinder 103 to hang block 100, the slider bolts 104 which compress the slider to the PV modules and compress the adhesives, the wire set screw 105 which hold the optional hanger wire 110, a hanger clip 111, the torsion spring 106, the clamp 107 for affixing the assembly to the rod or cable with cable set screw 105, the rod or cable 108 as seen in FIG. 11, the dampening cylinder 109 which acts to slow the movement of the swinging or swaying and the brake, swing stop 117. The rod or cable and frameless PV module are not shown in this exploded view of the PV module block attachment mechanism components but are shown in FIG. 10.

Figure 16:
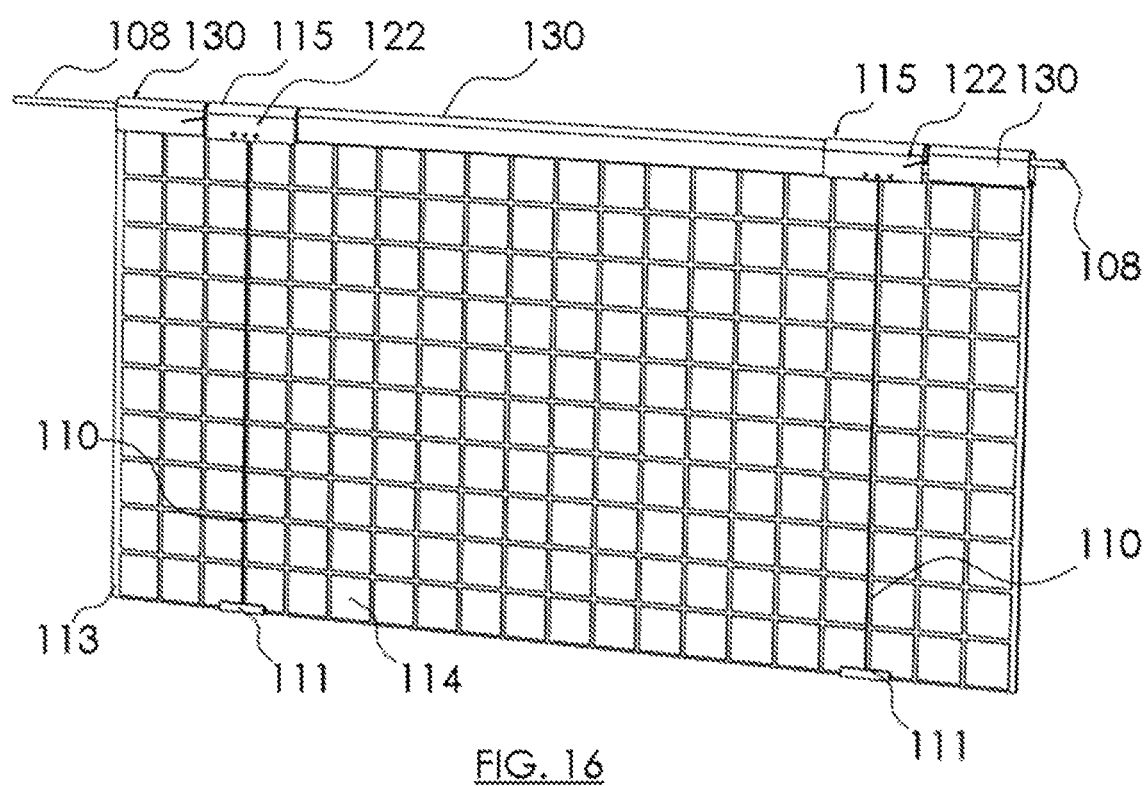
FIG. 16 illustrates a perspective view of the fairing shell around the attachment along with the fairing shell around the cable or rod and the solar PV module edge.

FIG. 16 illustrates a perspective view of the fairing shell 115 covering the PV module block attachment mechanisms 122 along with fairing shell 130 covering cable or rod 108 and the PV module 113 top edge. Fairing shell 115 can be a shorter version of fairing shell 130. both of which cover components below. This is very similar to FIG. 10 illustrating the PV module block attachment mechanism 122 here hidden behind the fairing shell 115 in FIG. 16. Optional hanger wires 110, hanger clips 111, along with the PV module 113, and PV cells 114 with 200 cells are shown. Here the rod or cable 108 is shown hanging at least one PV module. Optional hanger wires 110 with clips 111 are thin and placed on the front and back of the PV module as to not shade the PV cells below. The clips 111 can also help to keep the PV module 113 front and back glass surfaces in compression by squeezing the front and back surfaces of the PV module together. Fairing shell 115 around the PV module block attachment mechanism 122 is a thin covering to protect against weather and to streamline the system in high winds. Similarly, fairing shell 130 around cable or rod 108 protects the cable or rod 108 and streamlines the cable or rod 108 and PV module 113 in high winds.

What is claimed is:

1. A photovoltaic module mounting structure comprising:
   At least one photovoltaic module;
   At least one slider holding the at least one photovoltaic module;
   An elongated flexible member supported under tension;
   At least one photovoltaic module block attachment mechanism, wherein the at least one block attachment mechanism includes at least one slider attaching the at least one photovoltaic module to the elongated flexible member; and
   Wherein the at least one photovoltaic module is secured to the at least one slider at an edge of the photovoltaic module; and
   Wherein the said at least one photovoltaic module with mounting structure hangs under the force of gravity and swings about the axis of the elongated flexible member in response to wind.

2. The photovoltaic module mounting structure according to claim 1, wherein the at least one photovoltaic module is a bifacial photovoltaic module.

3. The photovoltaic module mounting structure according to claim 1, further comprising:
   At least one spring laterally disposed on the said elongated flexible member;
   At least one dampening mechanism;
   Wherein the at least one spring and the at least one dampening mechanism are attached to the module block attachment mechanism; and
   Wherein the at least one spring and the at least one dampening mechanism are attached to the said flexible elongated member with a fastener such as a clamp with a set screw; and
   Wherein the at least one spring and the at least one dampening mechanism limit a swinging motion in response to wind.

4. The photovoltaic module mounting structure according to claim 1 further comprising:
   At least one hanger clip that compresses the edge of photovoltaic module;
   At least one hanger wire;
   Wherein said at least one hanger clip is engaged with at least one hanger wire to hold the photovoltaic module weight, with said at least one hanger clip being located on the said photovoltaic module edge and having mechanical strength to hold the said photovoltaic module when attached to the said photovoltaic mounting structure with said at least one hanger wire being disposed.

5. The photovoltaic module mounting structure according to claim 1, wherein the structure further comprises at least one airfoil on the top edge of the photovoltaic module.

6. The photovoltaic module mounting structure according to claim 1, wherein the photovoltaic module is surrounded by reflective surfaces below the said structure and below the said photovoltaic module.

7. The photovoltaic module mounting structure according to claim 1 further comprising:
   At least one hollow cylinder;
   At least one edge tab connected to the said at least one hollow cylinder;
   Wherein the said at least one edge tab is attached into the said photovoltaic module layers or is attached onto the back of the said photovoltaic module or onto the front of the said photovoltaic module.

8. The photovoltaic module mounting structure according to claim 7, further comprising:
   At least one spring laterally disposed on the said elongated flexible member;
   At least one dampening mechanism;
   Wherein the at least one spring and the at least one dampening mechanism are attached to the at least one edge tab connected to the said at least one hollow cylinder; and
   Wherein the at least one spring and at least one dampening mechanism are attached to the said flexible elongated member with a fastener; and
   Wherein the at least one spring and the at least one dampening mechanism limit a swinging motion in response to wind.

9. The photovoltaic module mounting structure according to claim 4, wherein the at least one photovoltaic module includes a plurality of photovoltaic modules are attached to a plurality of elongated flexible members attached to a supporting structure comprising a space frame system with the said supporting structure having at least one vertical member attached vertically to said multiple tension members.

10. The photovoltaic module mounting structure according to claim 9, wherein the plurality of photovoltaic modules include gaps between sequential photovoltaic modules which let wind blow between the said photovoltaic modules.

11. The photovoltaic module mounting structure according to claim 9, wherein the structure includes security measures to discourage photovoltaic module theft comprising barbed wire or camera surveillance.

12. The photovoltaic module mounting structure according to claim 1 further comprising a pivot stop secured to the elongated flexible member to eliminate the swing of the photovoltaic module, to stop pivoting more than 90 degrees from a hanging vertical position.

13. The photovoltaic module mounting structure according to claim 1 wherein the structure is positioned on a building rooftop such that the height of the elongated flexible member above the building rooftop allows the bottom of the photovoltaic module to pivot without hitting the rooftop.

14. The photovoltaic module mounting structure according to claim 9 wherein the supporting structure of the space frame system consists of at least two vertical columns with at least one guy wire.

15. The photovoltaic module mounting structure according to claim 9, further comprising at least one hanger clip, at least one hanger wire, at least one pivot stop, at least one airfoil, and at least one photovoltaic module edge attachment to the at least one photovoltaic module, wherein the at least one photovoltaic module is a bifacial photovoltaic module.

* * * * *